Dec. 24, 1968 U. LOB ET AL 3,417,458

PRODUCTION OF ELECTRICAL SEMICONDUCTOR DEVICE

Original Filed Sept. 18, 1964

United States Patent Office 3,417,458

Patented Dec. 24, 1968

3,417,458

PRODUCTION OF ELECTRICAL SEMICONDUCTOR DEVICE

Udo Lob and Heinz Martin, Munich, Germany, assignors to Siemens Aktiengesellschaft, Berlin, Germany, a corporation of Germany Continuation of application Ser. No. 397,561, Sept. 18, 1964. This application May 17, 1966, Ser. No. 550,870

1 Claim. (Cl. 29—471.9)

This application is a continuation of application Ser. No. 397,561 filed Sept. 18, 1964 which is now abandoned.

Our invention relates to an improved electrical semiconductor device as well as to a method and means for producing the device in a simple and advantageous manner.

For satisfactory operation of semiconductor devices, it is important that the heat generated in the semiconductor member during operation be dissipated away from the member in a most efficient manner so that, on the one hand, a relatively high specific current loading of the semiconductor member is permissible without detriment to its quality and, on the other hand, electric overloads, particularly those of abrupt nature, will not damage the semiconductor member.

It is an object of our invention to devise a semiconductor device which satisfies these requirements to a greatly improved extent and which, besides, can be produced in a simple and inexpensive manner.

To achieve these objects, and in accordance with a feature of our invention, the electrical semiconductor member, such as a p-n junction rectifier member, is joined by solder bonds with two adjacent electrical conductor plates whose area extends greatly beyond the dimensions of the bonding area on which the contact face of the semiconductor member is joined with the conductor plate.

According to another, more specific feature of the invention, the two conductor plates are formed as elongated bars whose width is greater than that of the solder-bonded area and whose respective longitudinal axes extend transversely to each other.

By virtue of the above-mentioned features, the contact plates or bars become effectively active as cooling bodies, heat sinks or heat-conducting bridges for dissipating the Joule heat generated in the semiconductor member during its electrical operation, the heat transfer from the semiconductor member to each conductor plate or bar being determined essentially only by the heat-flow resistance of the solder bond.

According to another feature of our invention, the manufacture of such semiconductor devices is greatly facilitated by providing each of the above-mentioned conductor plates or bars with a group of at least three openings which are distributed about the solder-bonded contact faces of the semiconductor member, the holes of one plate or bar being coaxially aligned with those of the other. The purpose as well as the preferred arrangements of these holes will become apparent from the following.

When producing according to the invention a semiconductor device in which the conductor plates or bars have larger area dimensions than the bonding or heat-transfer area between the semiconductor member and the contact plate, care must be taken that the components of the device, prior to soldering them together, are placed into proper positions relative to one another and are reliably kept in such positions during the soldering operation so that the layers of solder material being employed will be situated in the correct position between the bonding surfaces of the semiconductor member and conductor plate, and so that the semiconductor member will occupy the desired position relative to a given heat-flow path from the member to the conductor plates. It is consequently desirable to employ suitable auxiliary equipment or apparatus when the conductor plates, the layers of solder material and the semiconductor member, such as a body of monocrystalline silicon doped to possess a p-n junction, are stacked upon each other. The auxiliary apparatus should meet the requirement that it impede as little as feasible any displacement of the components relative to each other in the stacking direction so that the components can move toward each other during the soldering process to provide for good mutual wetting by the solder. On the other hand, the auxiliary apparatus must prevent the exertion upon the layers of solder material, once they have passed to molten condition, such a high pressure as to cause squashing or lateral squeezing of the solder. Such lateral flow of the electrically conducting solder material would cause it to come into contact with the peripheral surface of the semiconductor member. Since at least one p-n junction, in the case of a semiconductor diode, protrudes from the peripheral surface, the solder would thus result in short-circuiting the p-n junction and thereby damage if not destroy the semiconductor member.

The desired manufacturing requirements just mentioned are achieved in the production of semiconductor devices according to the invention by employing an auxiliary apparatus or jig in which the component parts, namely the semiconductor member, layers of solder material and conductor plates can be stacked in the proper positions and in which the apparatus acts upon the periphery of the semiconductor member and the solder layers for holding them in these positions, whereas the conductor plates are kept in position by mutual engagement with the auxiliary device. More specifically, we employ, according to the invention, an auxiliary apparatus in which a base structure is provided with a number of raised elements, preferably in the form of pins upon which the above-mentioned conductor plates or bars can be stacked by passing mating holes of these conductor plates over the respective pins, whereas the semiconductor member and the intermediate layers of solder material can be interposed and prevented from moving laterally out of their melting positions by being closely surrounded by the group of pins.

The production method proceeds as follows. First, one of the perforated conductor plates is shoved upon the pins. Then, a layer of solder material is placed on top of the conductor plate between the group of pins. Thereafter the semiconductor member is placed coaxially on top of the solder layer and a second layer of solder material is placed coaxially on top of the semiconductor member between the pins. A second conductor plate, also suitably perforated, is then shoved upon the respective pins. When the stack of parts is thus completed, the entire assembly is placed in a furnace and heated to the soldering temperature, so that the contact faces of the semiconductor member are bonded with the adjacent contact plates.

The invention will be further described with reference to an embodiment of a semiconductor device and an embodiment of apparatus for manufacturing the device, illustrated by way of example on the accompanying drawing, in which.

Figure 1:
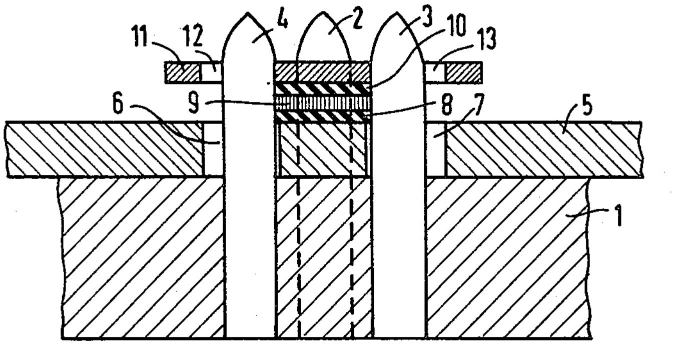
FIG. 1 is a vertical section through the semiconductor device assembled from its component parts and inserted into the manufacturing apparatus, the setcion being taken along the lines denoted by I—I in FIG. 2.
Figure 2:
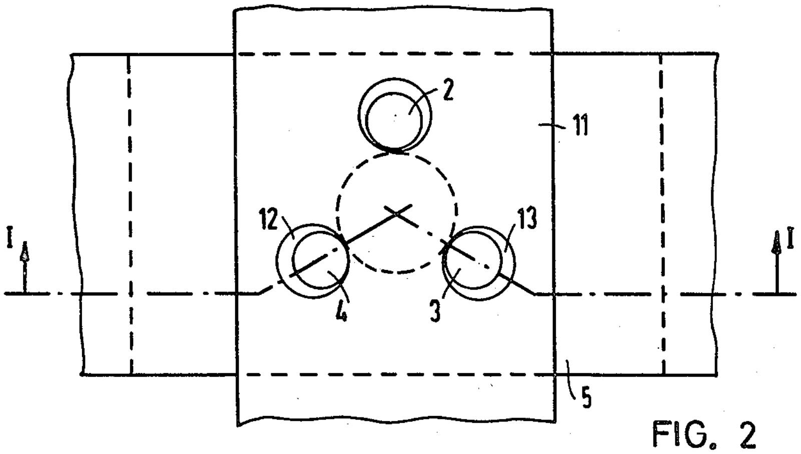
FIG. 2 is a plan view corresponding to FIG. 1.

The auxiliary jig-type apparatus according to FIGS. 1 and 2 comprises a rigid base structure 1 of steel or other suitable metal, which has a planar top surface. Three pins 2, 3, 4 are fastened in the base structure 1 and protrude in a vertical direction upward from the top surface. The pins 2, 3, 4 have a given length corresponding to the height of the assembly of parts to be stacked onto the base structure 1. Shoved onto the three pins 2, 3, 4 is an elongated conductor bar, of copper, for example, which is provided with three holes whose arrangement corresponds to the regular triangular arrangement of the pins 2, 3, 4. Only two of the holes 6 and 7 in bar 5 are visible in FIG. 1, and are shown thus traversed by the respective pins 4 and 3. After placing the bar 5 into the auxiliary apparatus, a circular foil member 8 of solder material is placed on top of the bar between the three pins 2, 3 and 4. The semiconductor member 9 proper is then placed on top of the solder foil member 8, also between the three pins. The semiconductor member 9 in this case has two regions doped for respectively different conductance type so as to form a p-n junction which protrudes at the cylindrical circumferential surface portion of the diode thus constituted by the semiconductor member. A second foil member 10 of solder is then placed on top of the semiconductor member 9, and thereafter, a second conductor bar with three holes is shoved over the three pins, only the two holes denoted by 12 and 13 corresponding to pins 4 and 3 being visible in FIG. 1. To facilitate shoving the conductor bars 5 and 11 onto the pins and inserting the parts 8, 9 and 10 between the three pins, these pins are preferably tapered at their respective free ends, as apparent from FIG. 1. The two conductor bars 5 and 11 have a width considerably greater than the diameter of the respective members 8, 9 and 10. The longitudinal axes of the bars 5 and 11 extend at right angles to each other as shown in the plan view of FIG. 2.

It is preferable to make the holes in the conductor bars 5 and 11 of larger diameter than the diameter of the guide pins 2, 3, 4. This permits employment of a stamping tool, for punching the holes into the bars, that is of a larger diameter so that the tool is mechanically more stable and its useful life is thereby increased. The larger diameter of the holes also facilitates removing the completely soldered semiconductor device from the auxiliary jig. It is, however, advisable to have the circular holes in the conductor plates or bars located in eccentric relation to the respective axes of the pins so that the periphery of each hole and the peripheral surface of the pin engaging the hole have the smallest spacing from each other at the locality closest to the stack of semicodnuctor parts i.e. the periphery of each hole is located substantially tangential to the circular cross section of the pin at the periphery of the inserted stack.

After the parts of the semiconductor device are stacked into the jig, the entire assembly is heated to a suitable temperature, preferably in a furnace, thereby soldering the bars 5 and 11 to the metallized contact faces of the intermediate semiconductor member.

If the parts 8, 9 and 10 of the semiconductor member have a circular shape, as described above and shown in FIGS. 1 and 2, only three pins 2, 3, 4 arranged at the vertices of an equilateral triangle are needed.

Figure 3:
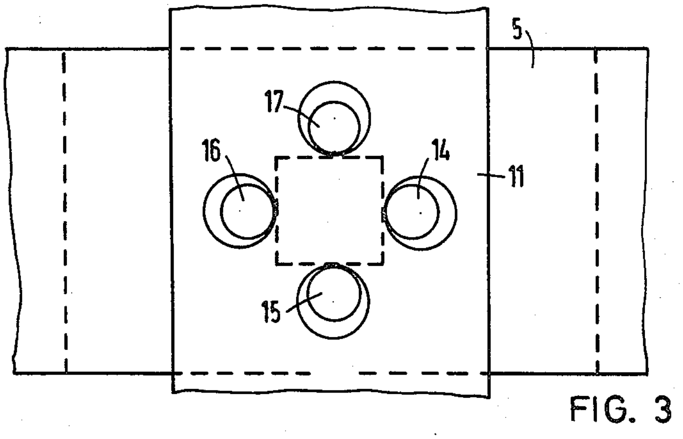
FIG. 3 shows a corresponding plan view of a different embodiment.

If the geometric shape of the parts 8, 9 and 10 is a quadrangle, such as a rectangle or square, then four pins 14 to 17 as shown in FIG. 3 are needed in order to reliably hold these parts in proper position relative to each other and relative to the conductor plates or bars.

If the shape of parts 8, 9 and 10 is a regular polygon having more than four sides, only three pins 2 to 4 as shown in FIGS. 1 and 2 are needed. Likewise, only three pins are required for some quadrangular shapes in which the angles formed by the four sides differ from 90°, for example in the case of a trapezoid where two of the pins abut the non-parallel sides and one of the pins abuts the longer of the two parallel sides.

The particular type and construction of the semiconductor member or diode 9 is not essential to the present invention and may correspond to any of the known devices of this kind. For example, the semiconductor member may be produced from weakly p-conducting or n-conducting silicon in which a region of the proposed conductance type is produced by diffusing a dopant into the silicon crystalline body from one of its planar surfaces down to the desired depth. The diffusion process is conventionally effected by depositing the doping substance, for example in the form of a paste containing the dopant substance proper, upon the semiconductor surface and then heating the semiconductor body. The semiconductor surface of the diffusion-doped region as well as the opposite surface in which the original type of conductance remains preserved, are then metallized. This can be done by coating these surfaces with nickel, either galvanically or preferably by a non-electrical precipitation method in a known and conventional manner. Such nickel-coated surfaces are of advantage because they reliably afford achieving a high-quality solder bond of the metallized surface with the adjacent conductor plate or bar, due to the fact that the nickel coating results in good wetting of the surface by the molten solder. The quality of the semiconductor faces to be solder-bonded can be further improved by covering the nickel coating with a thin layer of gold.

As mentioned, the conductor plates or bars consist of copper. However, they may also consist of other metals such as iron.

A material suitable as solder, for example, is a soft solder such as an alloy composed of 99% lead and 1% tin (by weight).

After the parts of the semiconductor device are soldered together with each other and with the two conductor plates or bars in the above-described manner, the resulting device is readily removable from the auxiliary jig and can be subjected to further processing. A semiconductor device according to the invention has the advantage that after it has been removed from the manufacturing jig, the peripheral surfaces of the semiconductor members are freely exposed so that they can be readily subjected to cleaning operations, particularly to etching and subsequent rinsing.

The invention is described as being employed for producing a device which contains only a single semiconductor member. However, it is applicable analogously for joining a number of semiconductor members in a given circuit connection. For this purpose, the base structure of the auxiliary apparatus is provided with several groups of pins, each group serving for the production of a stack containing one or more semiconductor members. For example, the semiconductor members thus grouped and electrically joined together by soldering may constitute a unit embodying a single-phase or multiphase rectifier bridge network, or a Y-point circuit.

An electrical semiconductor device produced in this manner, or a multi-component circuit made in this manner from several semiconductor members, may be completed in the conventional manner, for example by etching and subsequent encapsulation. For example, the finished devices may be inserted into a corresponding housing or may be embedded in a mass of casting resin, or may also be placed in a container filled with a solid substance, either compact or loose, for example pulverulent insulating material, or filled with a liquid or gaseous medium. Such a filler substance may either serve solely for dissipating heat or for providing convection cooling or forced-circulation cooling for the semiconductor device or devices.

The semiconductor members employed for the purposes of the invention, which preferably consist of flat plates or discs, may have any desired circumferential shape. For example, the perimeter of the semiconductor element may be continuously curved, preferably circular, or may also be polygonal.

Furthermore, instead of placing only one electrical semiconductor member between each two conductor plates, two or more semiconductor elements may be coaxially stacked upon each other between the two conductor plates, the mutually adjacent metallic contact faces or electrodes of the semiconductor members being then soldered together in the manner described above. When more than one semiconductor member is thus conntained in a stack between two conductor plates, electrical tap leads may be inserted between the semiconductor members in order to provide for a desired electrical circuit connection, for example a rectifier mid-point circuit or a rectifier bridge network.

We claim:

1. The method of producing electrical semiconductor devices having at least one semiconductor member with contact faces at its axially opposite sides and having two conductor plates soldered to said respective faces and provided with holes uniformly distributed about said faces, which comprises placing one of said plates upon a base having at least three upwardly protruding guide pins with said holes of said plate passing over said respective pins, stacking a solder layer and thereupon said member on top of said one plate between said pins so as to be held laterally in position by said pins, placing another layer of solder and ultimately the other plate on top so as to have the pins pass through the holes in said other plate, heating the assembly to soldering temperature so as to join said plates to said contact faces, and removing the resulting semiconductor device from the pins.

References Cited

UNITED STATES PATENTS

| | | | |
|---|---|---|---|
| 1,885,690 | 11/1932 | Doyle. | |
| 3,018,425 | 1/1962 | Wagner | 317—234 |
| 3,023,346 | 2/1962 | Wagner | 317—234 |
| 3,216,101 | 11/1965 | Miller. | |

JOHN F. CAMPBELL, *Primary Examiner.*

R. F. DROPKIN, *Assistant Examiner.*

U.S. Cl. X.R.

29—203, 467, 473.1, 493, 501, 589; 269—52